(12) United States Patent
Chan et al.

(10) Patent No.: US 11,145,641 B2
(45) Date of Patent: Oct. 12, 2021

(54) ELECTROSTATIC DISCHARGE PROTECTION DEVICE

(71) Applicant: MACRONIX International Co., Ltd., Hsinchu (TW)

(72) Inventors: Wing-Chor Chan, Hsinchu (TW); Che-Hong Chen, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 391 days.

(21) Appl. No.: 16/361,088

(22) Filed: Mar. 21, 2019

(65) Prior Publication Data
US 2020/0303367 A1 Sep. 24, 2020

(51) Int. Cl.
*H01L 27/02* (2006.01)
*H02H 9/04* (2006.01)

(52) U.S. Cl.
CPC ......... *H01L 27/0248* (2013.01); *H02H 9/046* (2013.01)

(58) Field of Classification Search
CPC .. H01L 27/0248; H01L 27/0262; H02H 9/046

USPC ........................................................ 257/146
See application file for complete search history.

(56) References Cited

U.S. PATENT DOCUMENTS

2020/0083212 A1* 3/2020 Zhao ...................... H02H 9/045

* cited by examiner

*Primary Examiner* — Dharti H Patel
(74) *Attorney, Agent, or Firm* — J.C. Patents

(57) ABSTRACT

An electrostatic discharge protection device including the following components is provided. A first PNP BJT includes a P-type region, first and second N-type well regions, first P-type, first N-type, and second P-type doped regions, and an N-type region. An NPN BJT includes first P-type and third N-type well regions, a second N-type doped region, a third P-type doped region, and a third N-type doped region. A second PNP BJT includes the first P-type and third N-type well regions, the third P-type doped region, the third N-type doped region, and a fourth P-type doped region. The second P-type doped region, the first N-type doped region, the third N-type doped region, and the fourth P-type doped region are coupled to a high voltage side terminal. The first P-type doped region, the second N-type doped region, and the third P-type doped region are coupled to a low voltage side terminal.

19 Claims, 3 Drawing Sheets

ELECTROSTATIC DISCHARGE PROTECTION DEVICE

BACKGROUND OF THE INVENTION

Field of the Invention

This invention relates to a semiconductor device, and particularly relates to an electrostatic discharge protection device.

Description of Related Art

Electrostatic discharge (ESD) refers to a phenomenon that charges accumulated in a non-conductor or a non-grounded conductor, and then rapidly moved and discharged through a discharge path in a short time. Electrostatic discharge would cause damage to the circuits in an integrated circuit. Therefore, an ESD protection device is usually placed in the integrated circuit to prevent damage caused by electrostatic discharge.

However, the ESD protection device currently applied to medium and high voltage semiconductor devices has a high trigger voltage, so that the protection effect cannot be achieved, and the internal circuit is damaged. Furthermore, the abovementioned has a low holding voltage, and thus is liable to cause latch-up issues, resulting in inoperability of the semiconductor element.

SUMMARY OF THE INVENTION

The invention provides an ESD protection device, which can have a low trigger voltage and a high holding voltage.

The invention provides an ESD protection device, which includes a substrate, at least one first PNP bipolar junction transistor (BJT), at least one NPN BJT, and at least one second PNP BJT. The first PNP BJT includes a P-type region, a first N-type well region, a second N-type well region, a first P-type doped region, a first N-type doped region, a second P-type doped region, and an N-type region. The P-type is located in the substrate. The first N-type well region is located in the substrate and is connected to a side of the P-type region. The second N-type well region is located in the substrate and is connected to another side of the P-type region. The first P-type doped region is located in the P-type region. The first N-type doped region is located in the second N-type well region. The first N-type doped region is isolated from the first P-type doped region. The second P-type doped region is located in the first N-type well region. The second P-type doped region is isolated from the first P-type doped region. The N-type region is located below the P-type region and is connected to the first N-type well region and the second N-type well region. The NPN BJT includes a first P-type well region, a third N-type well region, a second N-type doped region, a third P-type doped region, and a third N-type doped region. The first P-type well region is located in the substrate. The third N-type well region is located in the substrate and is connected to a side of the first P-type well region. The second N-type doped region is located in the first P-type well region. The third P-type doped region is located in the first P-type well region. The third N-type doped region is located in the third N-type well region. The third N-type doped region is isolated from the second N-type doped region and the third P-type doped region. The second PNP BJT includes the first P-type well region, the third N-type well region, the third P-type doped region, the third N-type doped region, and a fourth P-type doped region. The fourth P-type doped region is located in the third N-type well region. The fourth P-type doped region is isolated from the third P-type doped region. The second P-type doped region, the first N-type doped region, the third N-type doped region, and the fourth P-type doped region are coupled to a high voltage side terminal. The first P-type doped region, the second N-type doped region, and the third P-type doped region are coupled to a low voltage side terminal.

According to an embodiment of the invention, in the ESD protection device, the substrate is, for example, a P-type substrate.

According to an embodiment of the invention, in the ESD protection device, the P-type region may be the P-type substrate or a second P-type well region.

According to an embodiment of the invention, in the ESD protection device, the N-type region may be an N-type buried layer or a deep N-type well region.

According to an embodiment of the invention, in the ESD protection device, the NPN BJT may further include a fourth N-type doped region and a fifth P-type doped region. The fourth N-type doped region is located in the first P-type well region. The fifth P-type doped region is located in the first P-type well region. One of the third P-type doped region and the fifth P-type doped region is located between the second N-type doped region and the fourth N-type doped region. The other of the third P-type doped region and the fifth P-type doped region is isolated from the second N-type doped region and the fourth N-type doped region.

According to an embodiment of the invention, in the ESD protection device, the second PNP BJT further includes the fifth P-type doped region and a sixth P-type doped region. The sixth P-type doped region is located in the third N-type well region. The third N-type doped region is located between the fourth P-type doped region and the sixth P-type doped region.

According to an embodiment of the invention, in the ESD protection device, the first PNP BJT, the NPN BJT, and the second PNP BJT may be connected in parallel with each other.

According to an embodiment of the invention, in the ESD protection device, the quantity of the first PNP BJTs may be plural. The first PNP BJTs may be connected in parallel with each other.

According to an embodiment of the invention, in the ESD protection device, the first PNP BJT may have a symmetrical structure.

According to an embodiment of the invention, in the ESD protection device, the NPN BJT may have a symmetrical structure.

According to an embodiment of the invention, in the ESD protection device, the second PNP BJT may have a symmetrical structure.

According to an embodiment of the invention, the ESD protection device may further include a fourth N-type well region. The fourth N-type well region is located in the substrate and is connected to another side of the first P-type well.

According to an embodiment of the invention, the ESD protection device may further include an N-type buried layer. The N-type buried layer is located below the third N-type well region and is connected to the third N-type well region and the fourth N-type well region.

According to an embodiment of the invention, the ESD protection device may further include a fifth N-type doped region. The fifth N-type doped region is located in the fourth N-type well region.

According to an embodiment of the invention, the ESD protection device may further include an isolation structure. The isolation structure is located in the substrate between the first PNP BJT and the NPN BJT and between the first PNP BJT and the second PNP BJT.

According to an embodiment of the invention, the ESD protection device may further include an isolation structure. The isolation structure is located in the substrate between the first N-type doped region and the first P-type doped region.

According to an embodiment of the invention, the ESD protection device may further include an isolation structure. The isolation structure is located in the substrate between the second P-type doped region and the first P-type doped region.

According to an embodiment of the invention, the ESD protection device may further include an isolation structure. The isolation structure is located in the substrate between the third N-type doped region and the second N-type doped region and between the third N-type doped region and the third P-type doped region.

According to an embodiment of the invention, in the ESD protection device, the isolation structure is, for example, a shallow trench isolation (STI) structure or a field oxide layer.

According to an embodiment of the invention, in the ESD protection device, the substrate is, for example, a single crystal silicon substrate, an epitaxial silicon substrate, or a semiconductor-on-insulator (SOI) substrate.

Based on the above, in the ESD protection device according to the invention, the first PNP BJT can lower the trigger voltage of the ESD protection device, thereby effectively preventing internal circuit damage. Furthermore, the first PNP BJT can raise the holding voltage of the ESD protection device to prevent the latch-up issues. Moreover, after the NPN BJT and the second PNP BJT are triggered, the uniformity of current distribution when the ESD protection device is turned on can be improved and the anti-static performance can be improved.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
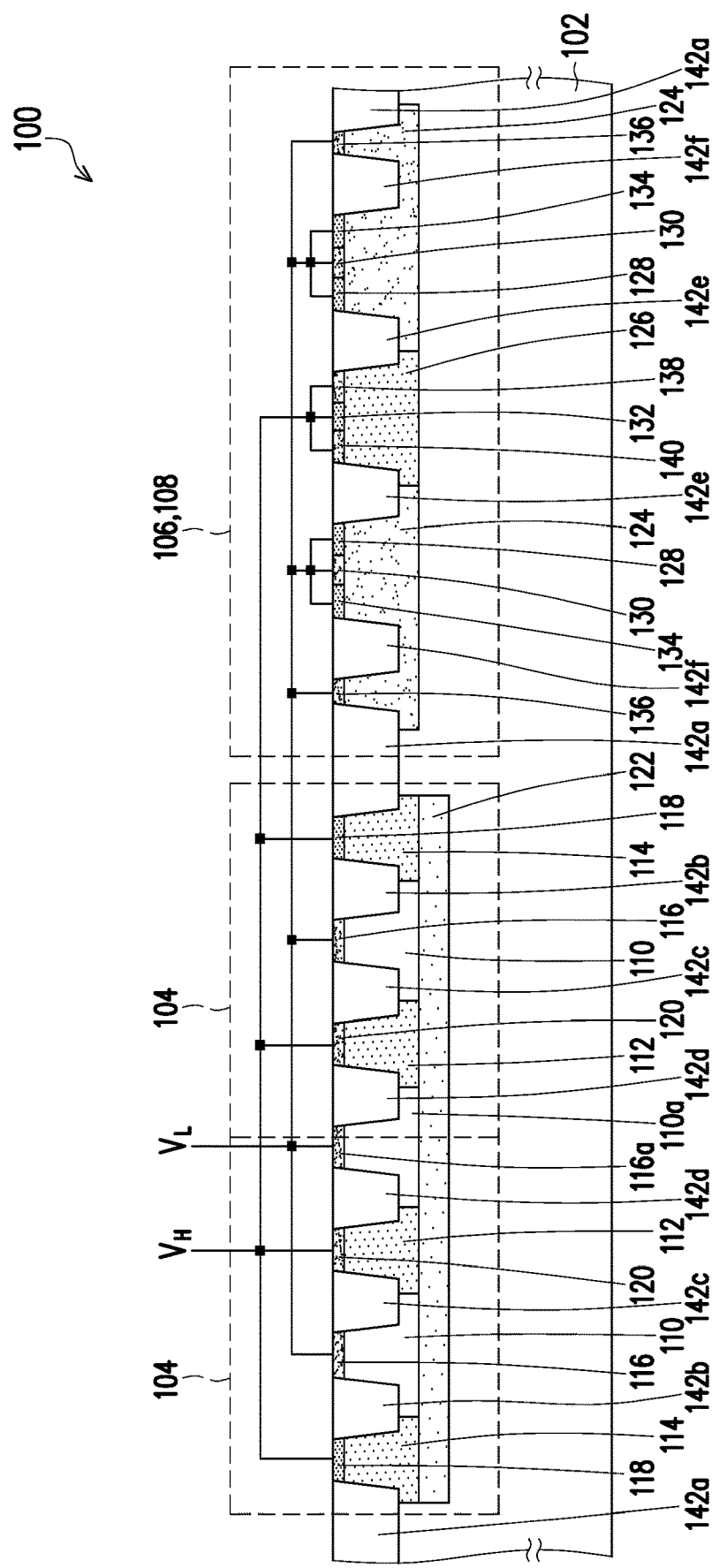
FIG. 1 is a cross-sectional view illustrating an ESD protection device according to an embodiment of the invention.

FIG. 1 is a cross-sectional view illustrating an ESD protection device according to an embodiment of the invention.

Referring to FIG. 1, an ESD protection device 100 includes a substrate 102, at least one first PNP BJT 104, at least one NPN BJT 106, and at least one second PNP BJT 108. The ESD protection device 100 may be applied to various integrated circuits. For example, the ESD protection device 100 may be applied to medium and high voltage semiconductor devices, but the invention is not limited thereto. The substrate 102 is, for example, a P-type substrate. The substrate 102 is, for example, a single crystal silicon substrate, an epitaxial silicon substrate, or a semiconductor-on-insulator (SOI) substrate.

The first PNP BJT 104 includes a P-type region 110, an N-type well region 112, an N-type well region 114, a P-type doped region 116, an N-type doped region 118, and a P-type doped region 120, and an N-type region 122. The P-type region 110 is located in the substrate 102. The P-type region 110 may be the P-type substrate or a P-type well region. In the present embodiment, the P-type region 110 is exemplified by the P-type substrate, but the invention is not limited thereto. The N-type well region 112 is located in the substrate 102 and is connected to a side of the P-type region 110. The N-type well region 114 is located in the substrate 102 and is connected to another side of the P-type region 110.

The P-type doped region 116 is located in the P-type region 110 and can serve as the collector of the first PNP BJT 104. The N-type doped region 118 is located in the N-type well region 114 and can serve as the base of the first PNP BJT 104. The N-type doped region 118 is isolated from the P-type doped region 116. The P-type doped region 120 is located in the N-type well region 112 and can serve as the emitter of the first PNP BJT 104. The P-type doped region 120 is isolated from the P-type doped region 116. The N-type region 122 is located below the P-type region 110 and is connected to the N-type well region 112 and the N-type well region 114. The N-type region 122 may be an N-type buried layer or a deep N-type well region. In the present embodiment, the N-type region 122 is exemplified by an N-type buried layer, but the invention is not limited thereto. In addition, the P-type region 110 may be isolated from the substrate 102 by the N-type well region 112, the N-type well region 114, and the N-type region 122.

Furthermore, the first PNP BJT 104 may further include a P-type region 110a and a P-type doped region 116a. P-type region 110a is located in a substrate 102 between the two adjacent first PNP BJTs 104. The P-type region 110a may be the P-type substrate or the P-type well region. In the present embodiment, the P-type region 110a is exemplified by the P-type substrate, but the invention is not limited thereto. Moreover, the P-type region 110a may be isolated from the substrate 102 by the N-type well region 112, the N-type well region 114, and the N-type region 122. The P-type doped region 116a is located in the P-type region 110a and can serve as the collector of the first PNP BJT 104. The P-type doped region 116a is isolated from the P-type doped region 120. The two adjacent first PNP BJTs 104 may share the P-type region 110a and the P-type doped region 116a.

In the present embodiment, the two adjacent first PNP BJTs 104 may have a symmetrical structure. In some embodiments, the first PNP BJT 104 itself may also have a symmetrical structure. For example, the P-type region 110a and the P-type doped region 116a in FIG. 1 may be omitted, and the adjacent two N-type well regions 112 in FIG. 1 may be merged, and the adjacent two P-type doped regions 120 in FIG. 1 may be merged, whereby the first PNP BJT 104 having a symmetrical structure itself can be formed.

The NPN BJT 106 includes a P-type well region 124, an N-type well region 126, an N-type doped region 128, a P-type doped region 130, and an N-type doped region 132.

The P-type well region 124 is located in the substrate 102. The N-type well region 126 is located in the substrate 102 and is connected to a side of the P-type well region 124.

The N-type doped region 128 is located in the P-type well region 124 and can serve as the emitter of the NPN BJT 106. The P-type doped region 130 is located in the P-type well region 124 and can serve as the base of the NPN BJT 106. The N-type doped region 132 is located in the N-type well region 126 and can serve as the collector of the NPN BJT 106. The N-type doped region 132 is isolated from the N-type doped regions 128 and the P-type doped regions 130.

Furthermore, the NPN BJT 106 may further include an N-type doped region 134 and a P-type doped region 136. The N-type doped region 134 is located in the P-type well region 124 and can serve as the emitter of the NPN BJT 106. The P-type doped region 136 is located in the P-type well region 124 and can serve as the base of the NPN BJT 106. The P-type doped region 130 is located between the N-type doped region 128 and the N-type doped region 134. The P-type doped region 136 is isolated from the N-type doped regions 128 and the N-type doped regions 134. However, as long as the NPN BJT 106 includes at least one of the N-type doped region 128 and the N-type doped region 134 and at least one of the P-type doped region 130 and the P-type doped region 136, it falls within the scope of the invention.

In the present embodiment, the P-type well regions 124, the N-type doped regions 128, the P-type doped regions 130, the N-type doped regions 134, and the P-type doped regions 136 may be respectively disposed on both sides of the N-type well region 126, so that the NPN BJT 106 itself may have a symmetrical structure, but the invention is not limited thereto. In some embodiments, the NPN BJT 106 may have the P-type well region 124, the N-type doped region 128, the P-type doped region 130, and the N-type doped region 134, and the P-type doped region 136 only on one side of the N-type well region 126. In some embodiments, when the quantity of the NPN BJTs 106 is plural, the adjacent two NPN BJTs 106 may have a symmetrical structure.

The second PNP BJT 108 includes the P-type well region 124, the N-type well region 126, the P-type doped region 130, the N-type doped region 132, and a P-type doped region 138. The second PNP BJT 108 and the NPN BJT 106 may share the P-type well region 124, the N-type well region 126, the P-type doped region 130, and the N-type doped region 132. The P-type doped region 130 can serve as the collector of the second PNP BJT 108. The N-type doped region 132 can serve as the base of the second PNP BJT 108. The P-type doped region 138 is located in the N-type well region 126 and can serve as the emitter of the second PNP BJT 108. The P-type doped region 138 is isolated from the P-type doped region 130.

Furthermore, the second PNP BJT 108 further includes the P-type doped region 136 and a P-type doped region 140. The P-type doped region 136 can serve as the collector of the second PNP BJT 108. The P-type doped region 140 is located in the N-type well region 126 and can serve as the emitter of the second PNP BJT 108. The N-type doped region 132 is located between the P-type doped region 138 and the P-type doped region 140. The P-type doped region 140 is isolated from the P-type doped region 130. However, as long as the second PNP BJT 108 includes at least one of the P-type doped region 130 and the P-type doped region 136 and at least one of the P-type doped region 138 and the P-type doped region 140, it falls within the scope of the invention.

In the present embodiment, the P-type well regions 124, the P-type doped regions 130, and the P-type doped regions 136 may be respectively disposed on both sides of the N-type well region 126, so that the second PNP BJT 108 itself may have a symmetrical structure, but the invention is not limited thereto. In some embodiments, the second PNP BJT 108 may have the P-type well region 124, the P-type doped region 130, and the P-type doped region 136 only on one side of the N-type well region 126. In some embodiments, when the quantity of the second PNP BJTs 108 is plural, the adjacent two second PNP BJTs 108 may have a symmetrical structure.

The P-type doped region 120, the N-type doped region 118, the N-type doped region 132, and the P-type doped region 138 are coupled to the high voltage side terminal $V_H$. The P-type doped region 116, the N-type doped region 128, and the P-type doped region 130 are coupled to the low voltage side terminal $V_L$. Moreover, the P-type doped region 140 may be coupled to the high voltage side terminal $V_H$. The P-type doped region 116a, the N-type doped region 134, and the P-type doped region 136 may be coupled to the low voltage side terminal $V_L$. The first PNP BJT 104, the NPN BJT 106, and the second PNP BJT 108 may be connected in parallel with each other.

In the present embodiment, the quantity of the first PNP BJTs 104 is exemplified by two (plural), the quantity of the NPN BJTs 106 is exemplified by one, and the quantity of the second PNP BJTs 108 is exemplified by one, but the invention is not limited thereto. As long as the quantity of the first PNP BJTs 104, the quantity of the NPN BJTs 106, and the quantity of the second PNP BJTs 108 are respectively at least one, it falls within the scope of the invention.

For example, in some embodiments, the quantity of the first PNP BJTs 104 may be one, the quantity of the NPN BJTs 106 and the quantity of the second PNP BJTs 108 may be plural. In some embodiments, the quantity of the first PNP BJTs 104, the quantity of the NPN BJTs 106, and the quantity of the second PNP BJTs 108 may each be plural. In some embodiments, the quantity of the first PNP BJTs 104, the quantity of the NPN BJTs 106, and the quantity of the second PNP BJTs 108 may each be one. Furthermore, when the quantity of the first PNP BJTs 104 is plural, the first PNP BJTs 104 may be connected in parallel with each other. When the quantity of the NPN BJTs 106 is plural, the NPN BJTs 106 may be connected in parallel with each other. When the quantity of the second PNP BJTs 108 is plural, the second PNP BJTs 108 may be connected in parallel with each other.

In the present embodiment, the method of coupling to the high voltage side terminal $V_H$, the method of coupling to the low voltage side terminal $V_L$, and the parallel connection method are, for example, using the interconnect structure for electrical connection.

Furthermore, the ESD protection device 100 may further include at least one of an isolation structure 142a, an isolation structure 142b, an isolation structure 142c, an isolation structure 142d, an isolation structure 142e, and an isolation structure 142f. The isolation structure 142a, the isolation structure 142b, the isolation structure 142c, the isolation structure 142d, the isolation structure 142e, and the isolation structure 142f are, for example, the STI structure or the field oxide layer. In the present embodiment, the isolation structure 142a, the isolation structure 142b, the isolation structure 142c, the isolation structure 142d, the isolation structure 142e, and the isolation structure 142f are exemplified by the STI structure, but the invention is not limited thereto.

The isolation structure 142a is located in the substrate 102 between the first PNP BJT 104 and the NPN BJT 106 and between the first PNP BJT 104 and the second PNP BJT 108. Thereby, the first PNP BJT 104 and the NPN BJT 106 can be isolated from each other, and the first PNP BJT 104 and the second PNP BJT 108 can be isolated from each other.

The isolation structure 142b is located in a substrate 102 between the N-type doped region 118 and the P-type doped region 116, whereby the N-type doped region 118 and the P-type doped region 116 can be isolated from each other. The isolation structure 142c is located in the substrate 102 between the P-type doped region 120 and the P-type doped region 116, whereby the P-type doped region 120 and the P-type doped region 116 can be isolated from each other. The isolation structure 142d is located in the substrate 102 between the P-type doped region 116a and the P-type doped region 120, whereby the P-type doped region 116a and the P-type doped region 120 can be isolated from each other.

The isolation structure 142e is located in the substrate 102 between the N-type doped region 132 and the N-type doped region 128 and between the N-type doped region 132 and the P-type doped region 130. In addition, the isolation structure 142e may be further located between the N-type doped region 132 and the N-type doped region 134, between the P-type doped region 138 and the N-type doped region 128, between the P-type doped region 138 and the P-type doped regions 130, between the P-type doped regions 138 and the N-type doped regions 134, between the P-type doped regions 140 and the N-type doped regions 128, between the P-type doped regions 140 and the P-type doped region 130, and between the P-type doped region 140 and the N-type doped region 134. Thereby, the N-type doped region 132, the P-type doped region 138, and the P-type doped region 140 can be respectively isolated from the N-type doped region 128, the P-type doped region 130, and the N-type doped region 134.

The isolation structure 142f is located in the substrate 102 between the P-type doped region 136 and the N-type doped region 128, between the P-type doped region 136 and the P-type doped region 130, and between the P-type doped region 136 and the N-type doped region 134. Thereby, the P-type doped region 136 can be isolated from the N-type doped region 128, the P-type doped region 130 and the N-type doped region 134.

In addition, in the layout design of the structure, the layout design of the N-type well region 114, the P-type doped region 116, the P-type doped region 116a, the N-type doped region 118, the P-type doped region 120, the N-type doped region 128, the P-type doped region 130, the N-type doped region 132, the N-type doped region 134, the P-type doped region 136, the P-type doped region 138, and the P-type doped region 140 may be strip-shaped, rectangular, hexagonal, octagonal or circular, but the invention is not limited thereto.

Based on the above embodiment, in the ESD protection device 100, the first PNP BJT 104 can lower the trigger voltage of the ESD protection device 100, thereby effectively preventing internal circuit damage. Furthermore, the first PNP BJT 104 can raise the holding voltage of the ESD protection device 100 to prevent the latch-up issues. Moreover, after the NPN BJT 106 and the second PNP BJT 108 are triggered, the uniformity of current distribution when the ESD protection device 100 is turned on can be improved and the anti-static performance can be improved.

Figure 2:
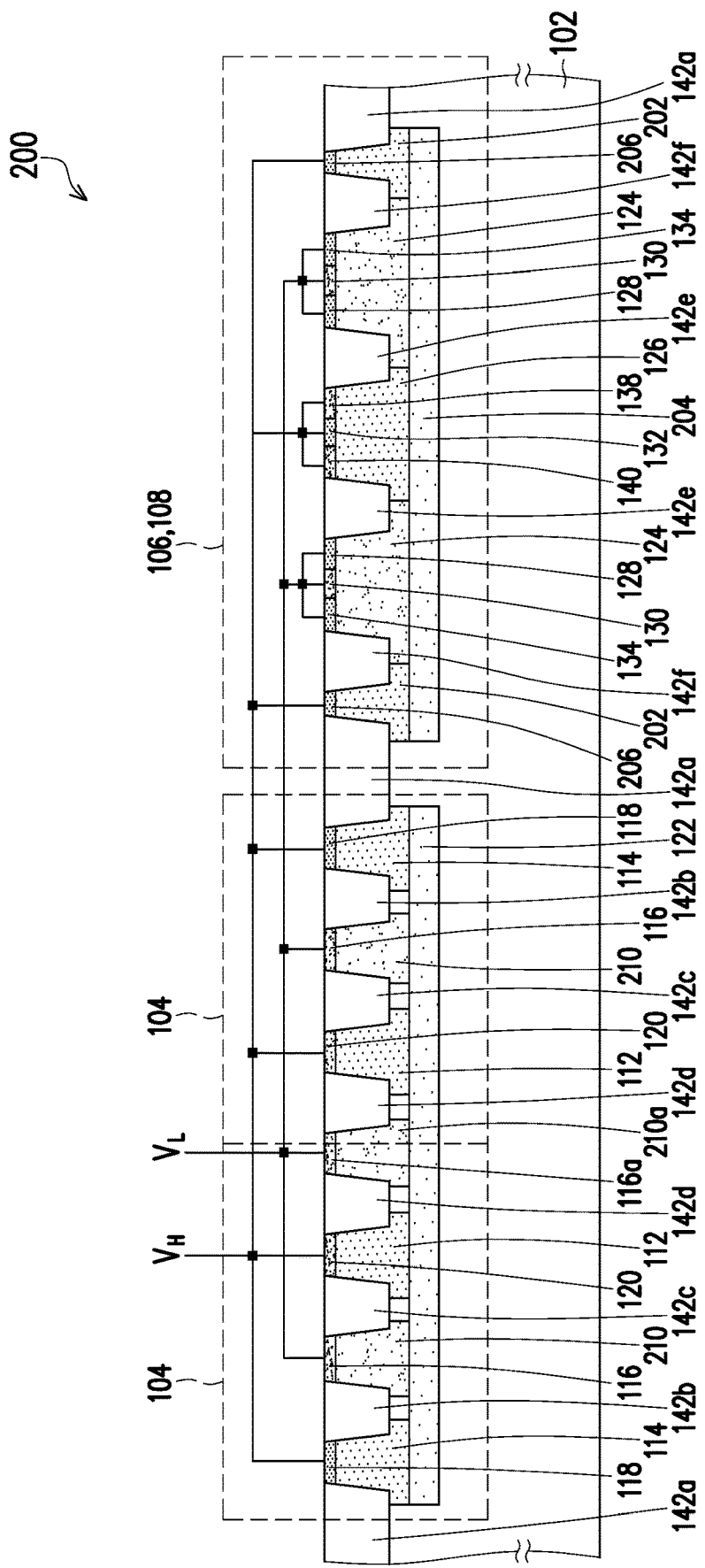
FIG. 2 is a cross-sectional view illustrating an ESD protection device according to another embodiment of the invention.

FIG. 2 is a cross-sectional view illustrating an ESD protection device according to another embodiment of the invention.

Referring to FIG. 1 and FIG. 2, the difference between the ESD protection device 200 of FIG. 2 and the ESD protection device 100 of FIG. 1 is as follows. In the ESD protection device 200, the P-type region 210 and the P-type region 210a are the P-type well regions. In addition, the ESD protection device 200 may further include at least one of an N-type well region 202, an N-type buried layer 204, and an N-type doped region 206. The N-type well region 202 is located in the substrate 102 and is connected to another side of the P-type well region 124. The N-type buried layer 204 is located below the P-type well region 124 and is connected to the N-type well region 126 and the N-type well region 202. Furthermore, the P-type well region 124 may be isolated from the substrate 102 by the N-type well region 126, the N-type well region 202, and the N-type buried layer 204. The N-type doped region 206 is located in the N-type well region 202. In the ESD protection device 200, the N-type doped region 206 is coupled to the high voltage side terminal $V_H$ and can serve as an electrode for providing an isolation voltage. That is, in the ESD protection device 200, the N-type doped region 206 is not used as the electrode of the NPN BJT 106 and the electrode of the second PNP BJT 108. In the ESD protection device 200 and the ESD protection device 100, the similar components are denoted by the same reference numerals and the description thereof is omitted.

Based on the above embodiment, in the ESD protection device 200, the first PNP BJT 104 can lower the trigger voltage of the ESD protection device 200, thereby effectively preventing internal circuit damage. Furthermore, the first PNP BJT 104 can raise the holding voltage of the ESD protection device 200 to prevent the latch-up issues. Moreover, after the NPN BJT 106 and the second PNP BJT 108 are triggered, the uniformity of current distribution when the ESD protection device 200 is turned on can be improved and the anti-static performance can be improved.

Figure 3:
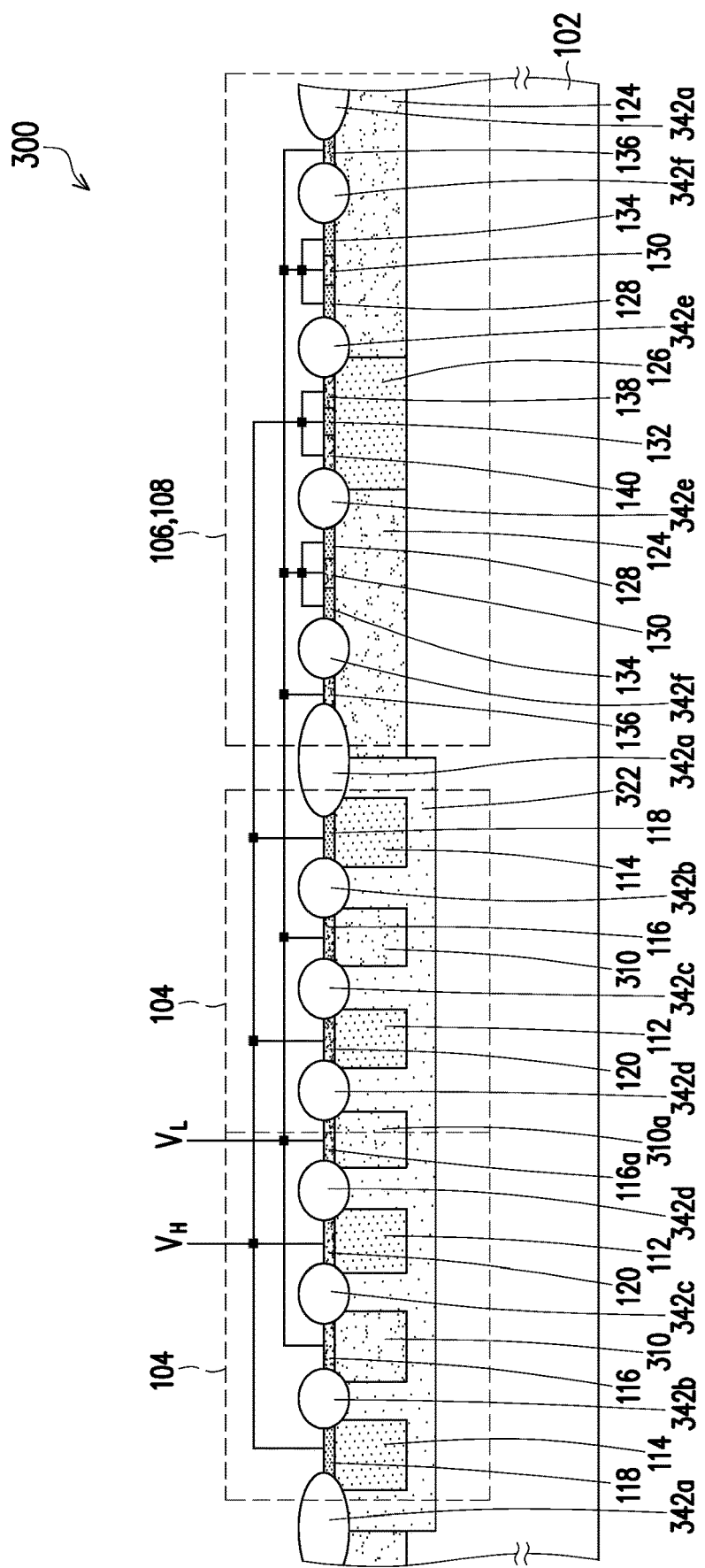
FIG. 3 is a cross-sectional view illustrating an ESD protection device according to another embodiment of the invention.

FIG. 3 is a cross-sectional view illustrating an ESD protection device according to another embodiment of the invention.

Referring to FIG. 1 and FIG. 3, the difference between the ESD protection device 300 of FIG. 3 and the ESD protection device 100 of FIG. 1 is as follows. In the ESD protection device 300, the P-type region 310 and the P-type region 310a are P-type well regions. The N-type region 322 is the deep N-type well region. The P-type region 310, the P-type region 310a, the N-type well region 112, and the N-type well region 114 may be located in N-type region 322. The isolation structure 342a, the isolation structure 342b, the isolation structure 342c, the isolation structure 342d, the isolation structure 342e, and the isolation structure 342f are the field oxide layer. Furthermore, in the ESD protection device 300 and the ESD protection device 100, the similar components are denoted by the same reference numerals and the description thereof is omitted.

Based on the above embodiment, in the ESD protection device 300, the first PNP BJT 104 can lower the trigger voltage of the ESD protection device 300, thereby effectively preventing internal circuit damage. Furthermore, the first PNP BJT 104 can raise the holding voltage of the ESD protection device 300 to prevent the latch-up issues. Moreover, after the NPN BJT 106 and the second PNP BJT 108 are triggered, the uniformity of current distribution when the ESD protection device 300 is turned on can be improved and the anti-static performance can be improved.

In addition, the ESD protection device 100, the ESD protection device 200, and the ESD protection device 300 can be manufactured by any standard process without the need for an additional mask.

In summary, since the ESD protection device of the aforementioned embodiment has the first PNP BJT, the ESD protection device can have a low trigger voltage and a high holding voltage, thereby preventing internal circuit damage and the latch-up issues. Furthermore, since the ESD protection device of the aforementioned embodiment has the NPN BJT and the second PNP BJT, the ESD protection device can have better uniformity of current distribution and better anti-static performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electrostatic discharge protection device, comprising:
    a substrate;
    at least one first PNP bipolar junction transistor comprising:
        a P-type region located in the substrate;
        a first N-type well region located in the substrate and connected to a side of the P-type region;
        a second N-type well region located in the substrate and connected to another side of the P-type region;
        a first P-type doped region located in the P-type region;
        a first N-type doped region located in the second N-type well region and isolated from the first P-type doped region;
        a second P-type doped region located in the first N-type well region and isolated from the first P-type doped region; and
        an N-type region located below the P-type region and connected to the first N-type well region and the second N-type well region;
    at least one NPN bipolar junction transistor comprising:
        a first P-type well region located in the substrate;
        a third N-type well region located in the substrate and connected to a side of the first P-type well region;
        a second N-type doped region located in the first P-type well region;
        a third P-type doped region located in the first P-type well region; and
        a third N-type doped region located in the third N-type well region and isolated from the second N-type doped region and the third P-type doped region; and
    at least one second PNP bipolar junction transistor comprising:
        the first P-type well region;
        the third N-type well region;
        the third P-type doped region;
        the third N-type doped region; and
        a fourth P-type doped region located in the third N-type well region and isolated from the third P-type doped region, wherein
    the second P-type doped region, the first N-type doped region, the third N-type doped region, and the fourth P-type doped region are coupled to a high voltage side terminal,
    the first P-type doped region, the second N-type doped region, and the third P-type doped region are coupled to a low voltage side terminal, and
    a quantity of the at least one first PNP bipolar junction transistor is plural, and the first PNP bipolar junction transistors are connected in parallel with each other.

2. The electrostatic discharge protection device according to claim 1, wherein the substrate comprises a P-type substrate.

3. The electrostatic discharge protection device according to claim 2, wherein the P-type region comprises the P-type substrate or a second P-type well region.

4. The electrostatic discharge protection device according to claim 1, wherein the N-type region comprises an N-type buried layer or a deep N-type well region.

5. The electrostatic discharge protection device according to claim 1, wherein the at least one NPN bipolar junction transistor further comprises:
    a fourth N-type doped region located in the first P-type well region; and
    a fifth P-type doped region located in the first P-type well region, wherein
    one of the third P-type doped region and the fifth P-type doped region is located between the second N-type doped region and the fourth N-type doped region, and
    the other of the third P-type doped region and the fifth P-type doped region is isolated from the second N-type doped region and the fourth N-type doped region.

6. The electrostatic discharge protection device according to claim 5, wherein the at least one second PNP bipolar junction transistor further comprises:
    the fifth P-type doped region; and
    a sixth P-type doped region located in the third N-type well region, wherein
    the third N-type doped region is located between the fourth P-type doped region and the sixth P-type doped region.

7. The electrostatic discharge protection device according to claim 1, wherein the at least one first PNP bipolar junction transistor, the at least one NPN bipolar junction transistor, and the at least one second PNP bipolar junction transistor are connected in parallel with each other.

8. The electrostatic discharge protection device according to claim 1, wherein the at least one first PNP bipolar junction transistor has a symmetrical structure.

9. The electrostatic discharge protection device according to claim 1, wherein the at least one NPN bipolar junction transistor has a symmetrical structure.

10. The electrostatic discharge protection device according to claim 1, wherein the at least one second PNP bipolar junction transistor has a symmetrical structure.

11. The electrostatic discharge protection device according to claim 1, further comprising:
    a fourth N-type well region located in the substrate and connected to another side of the first P-type well region.

12. The electrostatic discharge protection device according to claim 11, further comprising:
    an N-type buried layer located below the first P-type well region and connected to the third N-type well region and the fourth N-type well region.

13. The electrostatic discharge protection device according to claim 11, further comprising:
    a fifth N-type doped region located in the fourth N-type well region.

14. The electrostatic discharge protection device according to claim 1, further comprising:
    an isolation structure located in the substrate between the at least one first PNP bipolar junction transistor and the at least one NPN bipolar junction transistor and between the at least one first PNP bipolar junction transistor and the at least one second PNP bipolar junction transistor.

15. The electrostatic discharge protection device according to claim 14, wherein the isolation structure comprises a shallow trench isolation structure or a field oxide layer.

16. The electrostatic discharge protection device according to claim 1, further comprising:
   an isolation structure located in the substrate between the first N-type doped region and the first P-type doped region.

17. The electrostatic discharge protection device according to claim 1, further comprising:
   an isolation structure located in the substrate between the second P-type doped region and the first P-type doped region.

18. The electrostatic discharge protection device according to claim 1, further comprising:
   an isolation structure located in the substrate between the third N-type doped region and the second N-type doped region and between the third N-type doped region and the third P-type doped region.

19. The electrostatic discharge protection device according to claim 1, wherein the substrate comprises a single crystal silicon substrate, an epitaxial silicon substrate, or a semiconductor-on-insulator substrate.

\* \* \* \* \*